United States Patent
Dunbar et al.

(10) Patent No.: US 7,399,668 B2
(45) Date of Patent: Jul. 15, 2008

(54) METHOD FOR MAKING ELECTRONIC DEVICES HAVING A DIELECTRIC LAYER SURFACE TREATMENT

(75) Inventors: Timothy D. Dunbar, Woodbury, MN (US); Tommie W. Kelley, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 515 days.

(21) Appl. No.: 10/954,413

(22) Filed: Sep. 30, 2004

(65) Prior Publication Data

US 2006/0068519 A1    Mar. 30, 2006

(51) Int. Cl.
*H01L 21/8238*    (2006.01)
(52) U.S. Cl. .......................................... 438/216; 438/99
(58) Field of Classification Search ................... 438/82, 438/99, 216
See application file for complete search history.

(56) References Cited

U.S. PATENT DOCUMENTS

| | | | |
|---|---|---|---|
| 3,843,399 A | 10/1974 | Kaplan et al. | |
| 5,210,045 A | 5/1993 | Possin et al. | |
| 5,462,887 A | 10/1995 | Glück | |
| 5,888,591 A | 3/1999 | Gleason et al. | |
| 6,045,864 A | 4/2000 | Lyons et al. | |
| 6,045,877 A | 4/2000 | Gleason et al. | |
| 6,153,269 A | 11/2000 | Gleason et al. | |
| 6,156,435 A | 12/2000 | Gleason et al. | |
| 6,423,630 B1 | 7/2002 | Catabay et al. | |
| 6,433,359 B1* | 8/2002 | Kelley et al. | ................... 257/40 |
| 6,566,174 B1* | 5/2003 | Takechi et al. | .............. 438/149 |
| 6,617,609 B2 | 9/2003 | Kelley et al. | |
| 2002/0117691 A1 | 8/2002 | Choi et al. | |
| 2003/0100779 A1 | 5/2003 | Vogel et al. | |
| 2003/0102471 A1* | 6/2003 | Kelley et al. | ................... 257/40 |
| 2003/0105365 A1 | 6/2003 | Smith et al. | |
| 2003/0150384 A1 | 8/2003 | Baude et al. | |
| 2003/0151118 A1 | 8/2003 | Baude et al. | |

(Continued)

FOREIGN PATENT DOCUMENTS

DE    277 466 A1    4/1990

(Continued)

OTHER PUBLICATIONS

Bradley, A. et al., "Electrical Properties of Thin Organic Films", Journal of the Electrochemical Society, (Jan. 1963), pp. 15-22, vol. 110, No. 1.

(Continued)

*Primary Examiner*—George Fourson
*Assistant Examiner*—John M. Parker
(74) *Attorney, Agent, or Firm*—Lisa P. Fulton; Nicole J. Einerson; John M. Bronk

(57) ABSTRACT

A method of making an electronic device by (a) depositing a substantially nonfluorinated polymeric layer onto a dielectric layer using a plasma-based deposition technique selected from the group consisting of (i) plasma polymerizing a precursor comprising monomers, and (ii) sputtering from a target comprising one or more polymers of interpolymerized units of monomers, the monomers being selected from the group consisting of aromatic monomers, substantially hydrocarbon monomers, and combinations thereof; and (b) depositing an organic semiconductor layer adjacent to said polymeric layer.

18 Claims, 2 Drawing Sheets

U.S. PATENT DOCUMENTS

| | | | |
|---|---|---|---|
| 2003/0152691 A1 | 8/2003 | Baude et al. | |
| 2003/0209708 A1* | 11/2003 | Kubota | 257/40 |
| 2004/0185678 A1* | 9/2004 | Lee et al. | 438/780 |
| 2005/0012090 A1 | 1/2005 | Gerlach | |
| 2005/0035333 A1* | 2/2005 | Gerlach | 252/500 |
| 2005/0202279 A1* | 9/2005 | Zheng et al. | 428/690 |
| 2005/0218796 A1* | 10/2005 | Kubota | 313/506 |
| 2006/0006381 A1* | 1/2006 | Kelley et al. | 257/40 |
| 2006/0033086 A1* | 2/2006 | Gerlach | 252/500 |
| 2006/0270213 A1* | 11/2006 | Kubota | 438/623 |

FOREIGN PATENT DOCUMENTS

| | | |
|---|---|---|
| EP | 1 041 652 A2 | 10/2000 |
| EP | 1 443 571 | 8/2004 |
| JP | 55-101853 A | 8/1980 |
| JP | 60-66865 A | 4/1985 |
| JP | 61-29666 B | 7/1986 |
| JP | 62-288560 A | 12/1987 |
| WO | WO 01/85635 A1 | 11/2001 |
| WO | WO 03/019631 | 3/2003 |
| WO | WO 03/038143 A1 | 5/2003 |

OTHER PUBLICATIONS

Burkey, D. D. et al., "Structure and Thermal Properties of Thin Film Poly(α-methylstyrene) Deposited via Plasma-Enhanced CVD", Chemical Vapor Deposition, (2003), pp. 65-71, vol. 9, No. 2, WILEY-VCH Verlag GmbH & Co. KGaA, Weinheim.

Compendium of Analytical Nomenclature, Definitive Rules, "8.3.2.4 Ion-selective field effect transistor (ISFET) devices", (1997), 3rd Edition.

Inagaki, N., Ph.D., "Plasma Surface Modification and Plasma Polymerization", (1996), Technomic Publishing Company, Inc., Lancaster, PA.

Kwan, M. C. et al., "Pyrolytic CVD of Poly(organosiloxane) Thin Films", Chemical Vapor Deposition, (1997), pp. 299-301, vol. 3, No. 6, WILEY-VCH Verlag GmbH, D-69469 Weinheim.

Lau, K. K. S. et al., "Pulsed Plasma Enhanced and Hot Filament Chemical Vapor Deposition of Fluorocarbon Films", Journal of Fluorine Chemistry, (2000), pp. 119-126, vol. 104, Elsevier Science S. A.

Lau, K. K. S. et al., "Structure and Morphology of Fluorocarbon Films Growth by Hot Filament Chemical Vapor Deposition", Chemical Materials, (2000), pp. 3032-3037, vol. 12, American Chemical Society.

Murthy, S. K. et al., "Fluorocarbon-Organosilicon Copolymer Synthesis by Hot Filament Chemical Vapor Deposition", Macromolecules, (2000), pp. 1967-1972, vol. 35, American Chemical Society.

"Plasma Deposition and Treatment of Polymers", edited by W. W. Lee, R. d'Agostino, M. R. Wertheimer, Materials Research Society Symposium Proceedings vol. 544, (Nov. 30-Dec. 2, 1998), Materials Research Society, Warrendale, PA.

"Plasma Deposition Treatment, and Etching of Polymers", edited by R. d'Agostino, (1990), Academic Press, Inc., San Diego, CA.

Sander, L. C. et al., "Polycyclic Aromatic Hydrocarbon Structure Index", NIST (National Institute of Standards and Technology) Special Publication 922, (Dec. 1997), Chemical Science & Technology Laboratory, NIST, Gaithersburg, MD.

Sawa, G. et al., "Improvement of Dielectric Properties of Plasma Polymerized Styrene with Hydrocarbon Plasma Treatment", Japanese Journal of App. Phys., (Mar. 1981), pp. L201-L204, vol. 20, No. 3.

Smith, Jr. J. N., "Reflection and Dissociation of $H^2$ on Tungsten", Journal of Chemical Physics, (Aug. 15, 1962), pp. 898-904, vol. 37, No. 4.

Sze, S. M., "Physics of Semiconductor Devices", (1981), p. 442, 2nd Edition, John Wiley & Sons, New York, NY.

"Thin Films (Film Formation Techniques)", Encyclopedia of Chemical Technology, Kirk Othmer, (1997), pp. 1049-1056, vol. 23, 4th Edition, John Wiley & Sons.

Yasuda, H., "Plasma Polymerization", (1985), Academic Press, Inc.

U.S. Appl. No. 10/434,377, filed May 8, 2003, entitled "Organic Polymers, Electronic Devices, and Methods".

Wang et al., "High Mobility Organic Transistors Fabricated from Single Pentacene Microcrystals Grown on a Polymer Film", Applied Physics Letters, (Oct. 13, 2003), pp. 3108-3110, vol. 83, No. 15, American Institute of Physics.

Kelley et al., "High Performance Organic Thin Film Transistors", Mat. Res. Soc. Symp. Proc., (2003), pp. L6.5.1-L6.5.11, vol. 771, Materials Research Society.

Mackie, et al., "Characterization of Pulsed-Plasma-Polymerized Aromatic Films," Langmuir, 1998, vol. 14, pp. 1227-1235.

Yasuda, et al., "Some Aspects of Plasma Polymerization Investigated by Pulsed R.F. Discharge," Journal of Polymer Science: Polymer Chemistry Edition, 1977, vol. 15, pp. 81-97.

\* cited by examiner

METHOD FOR MAKING ELECTRONIC DEVICES HAVING A DIELECTRIC LAYER SURFACE TREATMENT

FIELD

This invention relates to methods for making transistors and other electronic devices having a dielectric layer surface treatment and, in another aspect, to transistors and other electronic devices having a dielectric layer surface treatment.

BACKGROUND

Organic thin film transistors (OTFTs) (that is, thin film transistors having an organic semiconductor) are gaining attention as a technology that enables a variety of applications centered around low-cost electronics. It is believed that organic semiconductors can be synthesized to incorporate the necessary electronic properties for a wide variety of devices. These devices can also be constructed to allow low-cost, reel-to-reel processing that is not currently possible for crystalline silicon microelectronics.

One area of concern, however, in organic electronic devices is the quality of the interface formed between the organic semiconductor and the gate dielectric. Efforts to control the semiconductor/dielectric interface such as, for example, interposing a polymeric layer between the organic semiconductor and the gate dielectric (see, for example, U.S. Pat. No. 6,617,609 (Kelley et al.) and U.S. patent application Ser. No. 03/0102471 (Kelley et al.)) have led to improvements in device properties.

Typically, these polymeric interface layers are solution deposited, for example, by spin-coating or similar techniques. In many instances, however, the other layers of the OTFT (for example, the gate electrode, the gate dielectric, the organic semiconductor, and the source electrode and drain electrode) are vapor deposited. Therefore, in order to solution deposit a polymeric interface layer on an otherwise vapor deposited transistor, a partially complete transistor must be removed from the vacuum chamber between vapor deposition of the gate dielectric and the organic semiconductor, and then returned to the chamber.

SUMMARY

In view of the foregoing, we recognize that there is a need for a quick and easy method to improve the semiconductor/dielectric interface of OTFTs.

Briefly, in one aspect, the present invention provides a method for making organic thin film transistors and other organic electronic devices having a dielectric layer surface treatment. The method comprises (a) depositing a substantially nonfluorinated polymeric layer onto a dielectric layer using a plasma-based deposition technique selected from the group consisting of (i) plasma polymerizing a precursor comprising monomers, and (ii) sputtering from a target comprising one or more polymers of interpolymerized units of monomers; and (b) depositing an organic semiconductor layer adjacent to said polymeric layer. The monomers can be selected from the group consisting of aromatic monomers, substantially hydrocarbon monomers, and combinations thereof.

As used herein, "substantially nonfluorinated" means that less than about 5% (preferably, less than about 1%; more preferably, 0%) of the carbons in the polymeric layer have fluorine substituents, and "substantially hydrocarbon" means" that less than about 30% (preferably, less than about 20%; more preferably, less than about 10%) of the non-hydrogen atoms in the monomer are not carbon atoms (that is, X is less than about 0.3 (preferably, less than about 0.2; more preferably, less than about 0.1), wherein $$X = \frac{\text{(number of non-H, non-C atoms)}}{\text{(number of non-H atoms)}}.$$

In another aspect, the invention provides a method of making an organic thin film transistor comprising (a) providing a substrate, (b) vapor depositing a gate electrode material on the substrate, (c) vapor depositing a gate dielectric on the gate electrode material, (d) plasma polymerizing a precursor comprising monomers selected from the group consisting of aromatic monomers, substantially hydrocarbon monomers, or combinations thereof onto the gate dielectric to form a substantially nonfluorinated polymeric layer thereon, (e) vapor depositing an organic semiconductor layer adjacent to the polymeric layer, and (f) vapor depositing a source electrode and a drain electrode contiguous to the organic semiconductor layer.

In yet another aspect, the invention provides organic thin film transistors and other organic electronic devices comprising a substantially nonfluorinated polymeric layer on a dielectric layer and an organic semiconductor layer adjacent to the polymeric layer; the polymeric layer comprising an aromatic polymer or a substantially hydrocarbon polymer and being substantially insoluble.

As used herein, "substantially insoluble" means that a solvent capable of making a solution comprising at least 20 weight percent of a non-plasma polymerized linear polymer (typically with molecular weight between 100,000 and 200,000 atomic mass units) at ambient conditions, dissolves less than 30 percent of a polymeric layer plasma polymerized from the same monomers.

The substantially nonfluorinated polymeric layer (hereinafter the "polymeric layer") can improve the properties of organic electronic devices such as OTFTs (for example, threshold voltage, subthreshold voltage, on/off ratio, and/or charge-carrier mobility) by controlling the interface between the organic semiconductor and the dielectric material. Advantageously, the method of the invention enables fabrication of an entire organic electronic device or OTFT, including the polymeric layer, using vapor deposition techniques. Therefore, there is typically no need to break vacuum during the fabrication process.

In addition, it has been discovered that polymeric layers deposited using the above-described method can be patterned using shadow-masking techniques. The polymeric layer can therefore be deposited and patterned in a single step. Furthermore, an entire organic electronic device or OTFT can be fabricated using shadow masking techniques.

Thus, the method of the invention meets the need in the art for a quick and easy method to improve the semiconductor/dielectric interface of OTFTs.

DETAILED DESCRIPTION

Figure 1:
FIG. 1 is a photograph of a patterned polymeric layer deposited on a silicon wafer by plasma polymerization at 300 W.

The methods of the invention can be used for making electronic devices such as, for example, capacitors, transistors (of which there are many types, including junction transistors and thin film transistors), diodes (for example, light emitting diodes), photovoltaics, and displays. Preferably, the electronic devices are organic electronic devices (that is, electronic devices having an organic semiconductor) such as, for example, organic thin film transistors and organic light emitting diodes.

Organic thin film transistors (OTFTs) are a particularly useful type of organic electronic device. OTFTs generally include a substrate, a gate electrode on the substrate, a gate dielectric on the gate electrode, a source electrode and a drain electrode adjacent to the gate dielectric, and an organic semiconductor layer adjacent to the gate dielectric and adjacent to the source and drain electrodes. These components can be assembled in a variety of configurations. For example, the source and drain electrodes can be adjacent to the gate dielectric with the organic semiconductor layer over the source and drain electrodes, or the organic semiconductor layer can be interposed between the source and drain electrodes and the gate dielectric.

The OTFTs of the present invention further include a polymeric layer interposed between the gate dielectric and the organic semiconductor layer. The polymeric layer can optionally be integrated with the gate dielectric.

Substrate

OTFTs made according to the present invention can be provided on a substrate. The substrate typically supports the OTFT during manufacturing, testing, and/or use. For example, one substrate may be selected for testing or screening various embodiments while another substrate is selected for commercial embodiments. Optionally, the substrate can provide an electrical function for the OTFT. Useful substrate materials include organic and inorganic materials. For example, the substrate can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS)), filled polymeric materials (for example, fiber-reinforced plastics (FRP)), fibrous materials, such as paper and textiles, and coated or uncoated metallic foils.

A flexible substrate can be used with the present invention. A flexible substrate allows for roll processing, which may be continuous, providing economy of scale and economy of manufacturing over flat and/or rigid substrates. The flexible substrate chosen preferably is capable of wrapping around the circumference of a cylinder of less than about 50 cm diameter (preferably, less than about 25 cm diameter; more preferably, less than about 10; most preferably, less than about 5 cm) without distorting or breaking. The force used to wrap the flexible substrate of the invention around a particular cylinder typically is low, such as by unassisted hand (that is, without the aid of levers, machines, hydraulics, and the like). The preferred flexible substrate can be rolled upon itself.

Gate Electrode

The gate electrode of an OTFT can be any useful conductive material. For example, the gate electrode can comprise doped silicon, or a metal, such as aluminum, copper, chromium, gold, silver, nickel, palladium, platinum, tantalum, and titanium, and transparent conducting oxides such as indium tin oxide. Conductive polymers also can be used, for example polyaniline or poly(3,4-ethylenedioxythiophene)/poly(styrene sulfonate) (PEDOT:PSS). In addition, alloys, combinations, and multilayers of these materials can be useful. In some OTFTs, the same material can provide the gate electrode function and also provide the support function of a substrate. For example, doped silicon can function as the gate electrode and support the OTFT.

Gate Dielectric

The gate dielectric is generally provided on the gate electrode. The gate dielectric electrically insulates the gate electrode from the balance of the OTFT device. It can be deposited on the OTFT as a separate layer, or formed on the gate by oxidizing (including anodizing) the gate material to form the gate dielectric. The gate dielectric preferably has a relative dielectric constant above about 2 (more preferably, above about 5). The dielectric constant of the gate dielectric can be relatively high, for example, 80 to 100 or higher. Useful materials for the gate dielectric can comprise, for example, organic or inorganic electrically insulating materials.

Specific examples of organic materials useful for the gate dielectric include polymeric materials, such as polyvinylidenefluoride (PVDF), cyanocelluloses, polyimides, epoxies, and the like.

Other useful organic materials are described in copending application U.S. Ser. No. 10/434,377, filed on May 8, 2003, which is herein incorporated by reference. These materials include cyano-functional (preferably, cyano-functional styrenic) polymers, preferably with relatively high dielectric constants. Suitable polymers preferably include a cyano-functional portion and a portion that provides a relatively high dielectric constant to the overall polymer, which portions may be the same or different.

Useful cyano-functional polymers include substantially nonfluorinated organic polymers having repeat units of the formulas:

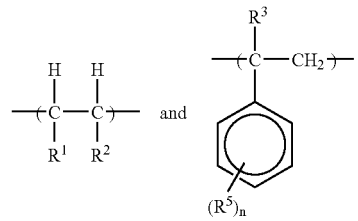

wherein
each $R^1$ is independently H, an aryl group (including aralkyl and alkaryl), Cl, Br, I, or an organic group that includes a crosslinkable group (that is, one or more crosslinkable groups);
each $R^2$ is independently H, an aryl group (including aralkyl and alkaryl), or $R^4$;
each $R^3$ is H or methyl;
each $R^5$ is a substituent on the aromatic ring and is independently an alkyl group, a halogen, or $R^4$;
n is 0-3; and
each $R^4$ is independently an organic group that includes at least one CN group and has a molecular weight of about 30 to about 200 per CN group; with the proviso that at least one repeat unit in the polymer includes an $R^4$. Preferably at least one $R^1$ includes a crosslinkable group.

Other useful cyano-functional polymers include organic polymers (preferably, substantially nonfluorinated organic polymers) having repeat units of the formulas:

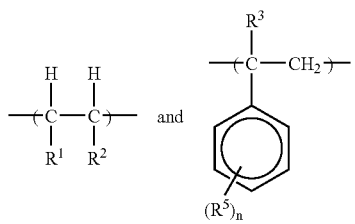

wherein each $R^1$ is independently an organic group that includes a crosslinkable group (that is, one or more crosslinkable groups);

each $R^2$ is independently H, an aryl group (including alkaryl and aralkyl), or $R^4$;

each $R^3$ is independently H or methyl;

each $R^5$ is a substituent on the aromatic ring and is independently an alkyl group, a halogen, or $R^4$;

n is 0-3; and each $R^4$ is independently an organic group that includes at least one CN group and has a molecular weight of about 30 to about 200 per CN group; with the proviso that at least one repeat unit in the polymer includes an $R^4$.

Preferred cyano-functional polymers include styrenic interpolymerized units (optionally cyano-functional styrenic units).

In addition, other organic materials that can be plasma polymerized can be used as gate dielectrics. Suitable examples include plasma polymers where the monomer is selected from the group consisting of styrene, ethylene, isobutylene and tetrafluoroethylene. Monomers for plasma polymerization need not have reactive functional groups that traditional polymerizations need, and consequently, dielectric films can be made from monomers such as methane, ethane and other alkanes; benzene and substituted benzenes; naphthalene and substituted naphthalenes; anthracene, substituted anthracenes; and phenanthrene and substituted phenanthrenes. Monomers containing heteroatoms such as oxygen, nitrogen, sulfur and the halogens as well as more unusual heteroatoms such as selenium, tin, mercury and titanium have also been plasma polymerized to make dielectric films. Further details can be found in the art, for example, in Bradley et al., Journal of the Electrochemical Society, vol. 110, no. 1, pp. 15-22 (1963).

Specific examples of inorganic materials useful for the gate dielectric include strontiates, tantalates, titanates, zirconates, aluminum oxides, silicon oxides, tantalum oxides, titanium oxides, hafnium oxides, silicon nitrides, barium titanate, barium strontium titanate, and barium zirconate titanate. In addition, alloys, combinations, and multilayers of these materials can be used for the gate dielectric.

Preferred inorganic materials for the gate dielectric include aluminum oxides, silicon oxides, and silicon nitrides.

Source and Drain Electrodes

The source electrode and drain electrode are separated from the gate electrode by the gate dielectric, while the semiconductor layer can be over or under the source electrode and drain electrode. The source and drain electrodes can be any useful conductive material. Useful materials include most of those materials described above for the gate electrode, for example, aluminum, barium, calcium, chromium, copper, gold, silver, nickel, palladium, platinum, titanium, transparent conducting oxides such as indium tin oxide, polyaniline, PEDOT:PSS, other conducting polymers, alloys thereof, combinations thereof, and multilayers thereof. Some of these materials are appropriate for use with n-type semiconductor materials and others are appropriate for use with p-type semiconductor materials, as is known in the art.

Organic Semiconductors

Useful organic semiconductor materials include acenes and substituted derivatives thereof. Particular examples of acenes include anthracene, naphthalene, tetracene, pentacene, and substituted pentacenes (preferably pentacene or substituted pentacenes). Other examples include semiconducting polymers, perylenes, fullerenes, phthalocyanines, oligothiophenes, polythiophenes, polyphenylvinylenes, polyacetylenes, metallophthalocyanines and substituted derivatives. Useful bis-(2-acenyl) acetylene semiconductor materials are described in copending application U.S. Ser. No. 10/620,027, filed on Jul. 15, 2003, which is herein incorporated by reference. Useful acene-thiophene semiconductor materials are described in copending application U.S. Ser. No. 10/641,730, filed on Aug. 15, 2003, which is herein incorporated by reference.

Substituted derivatives of acenes include acenes substituted with at least one electron-donating group, halogen atom, or a combination thereof, or a benzo-annellated acene or polybenzo-annellated acene, which optionally is substituted with at least one electron-donating group, halogen atom, or a combination thereof. The electron-donating group is selected from an alkyl, alkoxy, or thioalkoxy group having from 1 to 24 carbon atoms. Preferred examples of alkyl groups are methyl, ethyl, n-propyl, isopropyl, n-butyl, sec-butyl, n-pentyl, n-hexyl, n-heptyl, 2-methylhexyl, 2-ethylhexyl, n-octyl, n-nonyl, n-decyl, n-dodecyl, n-octadecyl, and 3,5,5-trimethylhexyl. Substituted pentacenes and methods of making them are taught in U.S. patent application Ser. Nos. 03/0100779 (Vogel et al.) and 03/0105365 (Smith et al.), which are herein incorporated by reference.

Further details of benzo-annellated and polybenzo-annellated acenes can be found in the art, for example, in National Institute of Standards and Technology (NIST) Special Publication 922 "Polycyclic Aromatic Hydrocarbon Structure Index", U.S. Govt. Printing Office, by Sander and Wise (1997).

Polymeric Layer

OTFTs made according the present invention include a substantially nonfluorinated polymeric layer disposed on the gate dielectric. The polymeric layer comprises an aromatic polymer or a substantially hydrocarbon polymer. In OTFTs of the invention, the polymeric layer is substantially insoluble.

Monomers that are useful in making the polymeric layer include monomers selected from the group consisting of aromatic monomers, substantially hydrocarbon monomers, and combinations thereof.

Examples of useful monomers include naphthalene, substituted naphthalenes such as methyl- and ethyl-naphthalenes, benzene, ethyl benzene, toluene, xylene, mesitylene, styrenes, phenylacetylene, fluorene, and phenanthrene as well as non-aromatic molecules such as alkanes (for example, methane, ethane, propane, butane, pentane, hexane, and the like), cyclic alkanes (for example, cyclopropane, cyclobutane, cyclopentane, cyclohexane, and the like), olefins (for example, ethylene, propylene, 1-butene, 2-butene, and the like), alkynes (for example, acetylene, 1-propyne, 1-butyne, 2-butyne, and the like), and combinations of the above structures including branching, such as isobutylene, 3-ethylcyclohexene, or 2-methylcyclopentane and the like, and combinations thereof.

An upper limit to the molecular weight of the monomer is specified only by the requirement that there is a method to vaporize the molecule. Potentially, large molecules can be employed by providing the molecule in solid form in a plasma polymerization chamber and heating it directly to vaporize it.

Preferably, the monomers are aromatic. More preferably, aromatic monomers comprising only hydrocarbon substituents are used.

Specific examples of useful aromatic monomers include benzene, ethyl benzene, toluene, o-xylene, m-xylene, p-xylene, mesitylene, styrenes, phenylacetylene, naphthalene, 1-methylnaphthalene, 2-methylnapthalene, 1-ethylnaphthalene, 2-ethylnaphthalene, 1-vinylnaphthalene, and 2-vinylnaphthalene.

Preferably, the polymeric layer comprises interpolymerized units of monomers selected from the group consisting of naphthalene, benzene, ethyl benzene, toluene, xylene, mesitylene, styrenes, phenylacetylene, and combinations thereof. More preferably, the polymeric layer comprises styrenic interpolymerized units. Even more preferably, the polymeric layer comprises styrenic interpolymerized units derived from monomers selected from the group consisting of α-methylstyrene, 4-tert-butylstyrene, 2-methylstyrene, 3-methylstyrene, 4-methylstyrene, and combinations thereof. Most preferably, the polymeric layer comprises styrenic interpolymerized units derived from α-methylstyrene.

The polymeric layer is typically between about 1 nm and about 20 nm thick (preferably, between about 2 nm and about 15 nm; more preferably, between about 5 nm and about 10 nm). If the polymeric layer is integrated with the dielectric layer, the combined layer is typically less than about 300 nm (preferably, less than about 200 nm; more preferably, less than about 100 nm).

Fabrication

The thin film electrodes (that is, the gate electrode, source electrode, and drain electrode), can be provided by any useful means such as, for example, plating, ink jet printing, or vapor deposition (for example, thermal evaporation or sputtering). Preferably, the thin film electrodes are provided by vapor deposition.

The organic semiconductor layer can be provided by any useful means such as, for example, solution deposition, spin coating, printing techniques, or vapor deposition (preferably, by vapor deposition).

The gate dielectric can be provided by any useful means such as, for example vapor deposition or plasma-based deposition.

Some gate dielectric materials such as, for example, the cyano-functional polymers and others described above, can be provided using plasma-based deposition techniques. The polymeric layer can also be provided using plasma-based deposition techniques.

Plasma-based deposition refers to the formation and deposition of polymeric materials under the influence of plasma (that is, partially ionized gas). Plasma-based deposition includes, for example, plasma polymerization (for example, plasma-enhanced chemical vapor deposition (PE CVD), glow discharge polymerization, and the like), and sputtering (for example, direct current (DC) sputtering, magnetron sputtering, and radio frequency (RF) sputtering).

Films deposited by plasma-based deposition generally exhibit characteristics such as, for example, smoothness, conformation to the substrate, and relatively low amounts of residual reactive components. Such characteristics are desirable for good transistor performance.

In addition, the polymeric layers deposited by plasma-based techniques according to the invention are typically highly branched and cross-linked, and are therefore substantially insoluble. Insolubility is highly desirable for applications that require additional processing on top of the OTFT, for example, during the fabrication of displays.

Plasma polymerization involves the formation of polymeric thin films under the influence of plasma (that is, partially ionized gas). When plasma interacts with organic molecules (for example, monomers) in vapor, polymers are formed. Plasma is thus the initiator that causes plasma polymerization.

Plasmas can be created by a variety of means such as, for example, by direct current, radio frequency, or electron-cyclotron-resonance techniques.

During plasma polymerization, many factors can affect the chemical process. For example, reactor characteristics such as electrode size, the distance between electrodes, and the frequency of electric power can affect the process. Adjustable process parameters such as monomer flow rate, system pressure, and discharge power can also affect the process.

It is known in the art that it is possible to change the structure of a film resulting from plasma polymerization of a given monomer by changing the ratio of the input power (W) the plasma receives relative to the flow rate of the monomer (F) being admitted to a vacuum chamber and removed by either polymerization or a vacuum pump. The ratio of W/F is essentially a measure of the amount of energy input per mass of monomer being polymerized. Consider, for example, a polymer film (film 1) formed by plasma polymerization performed under given power (W1) and flow rate (F1). Another polymer film 2) formed by plasma polymerization performed under increased power (W2) and increased flow rate (F2) can be very similar to film 1 as long as the ratio of W2/F2 is the same as W1/F1. Because of differences in geometry between various plasma polymerization reactor designs, however, W/F is characteristic to a given reactor.

Figure 3:
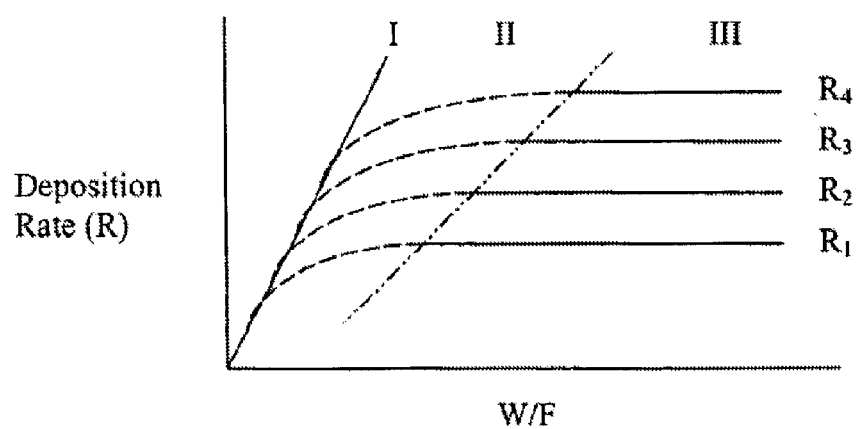
FIG. 3 is a plot of deposition rate (R) versus W/F.

The polymeric layer of the invention can be created using plasma polymerization when there is enough input power to ignite a stable plasma. Preferably, regions of such high input power relative to flow rate that ablation of the substrate or any already deposited film should be avoided. More preferably, the energy input to the plasma should be adjusted so that plasma polymerization operates in the power deficient region (II) of a plot of deposition rate (R) versus W/F, as shown in FIG. 3.

It is also known in the art that certain conditions during plasma polymerization can lead to the formation of plasma polymerized powders of the input monomer, rather than plasma polymerized films of the input monomer. One of skill in the art will recognize that parameters such as the geometry of the deposition system, choice of W/F, and system pressure can be chosen to minimize powder formation.

Plasma polymerization can be carried out in a continuous mode or a pulsed mode. For pulsed plasma polymerization, plasma is provided in the deposition chamber by pulsing the plasma excitation applied to the precursor gas introduced into the chamber (that is, the excitation power is turned off and on with a desired duty cycle rather than being applied as a continuous plasma excitation). Pulsed plasma excitation can enable better process control than continuous plasma processes. As known in the art, plasma polymerization involves multiple competing mechanisms. Pulsing can allow some control over which of the simultaneously operating mechanisms of plasma polymerization predominates, and can therefore enable different properties in the final plasma polymerized film, which may be advantageous to their use as surface treatments.

Further details on plasma polymerization can be found in the art (see, for example, H. Yasuda, *Plasma Polymerization*, Academic Press, Inc., Orlando, Fla. (1985), or N. Inagaki, *Plasma Surface Modification and Plasma Polymerization*, Technomic Publishing Company, Inc., Lancaster, Pa. (1996)).

Sputtering involves the deposition of atoms that have been ejected from a "target" composed of the desired coating material by momentum transfer from an atomic-sized energetic bombarding particle. The energetic particle is typically a gaseous ion that has been accelerated from a plasma. During sputtering, energetic particles strike the target and cause atoms from the target to be ejected from it. The ejected atoms are then plasma polymerized in the gas plasma.

In DC sputtering, a plasma is formed when a high negative DC voltage is applied across a low-pressure gas such as, for example, argon, neon, krypton, xenon, or radon. A DC diode argon-sputtering plasma can be operated, for example, at about 1-3 Pa argon gas pressure and at an applied voltage of about 2000-5000 volts. Magnetic fields, or a DC magnetron configuration, can be used to confine the plasma near the target surface and thus increase plasma density and sputtering rates.

In RF sputtering, a plasma is formed using electromagnetic power in the MHz region (for example, 13.56 MHz). RF sputtering is often preferable for depositing dielectric or insulating materials because charge can build up on the target during DC sputtering. By using an RF potential on the target, dielectric or insulating materials can be sputtered by periodically neutralizing any charge buildup on the target.

Many variables can affect the sputtering process for a particular material (for example, sputtering gas, sputtering pressure, substrate temperature, deposition rate, target voltage, target power, deposition geometry, etc.). Thus, as will be recognized by one of skill in the art, various process parameters can be adjusted to achieve optimum conditions for a given material. Further details on sputtering can be found in the art, for example, in *Encyclopedia of Chemical Technology*, Kirk-Othmer, Fourth Ed., Vol. 23, pages 1049-1056, John Wiley & Sons (1997).

When the gate dielectric is a material that can be deposited using plasma-based deposition techniques, an integrated gate dielectric/polymeric layer can be obtained. Integrated layers can be desirable because the polymeric layer can be more strongly bound to the dielectric layer than when the layers are made separately, thus producing a more stable electronic device. In addition, integrating the layers can facilitate patterning of the layers since, for example, one shadow mask can be used for both the dielectric material and the polymeric surface treatment, and the shadow mask need not be moved/realigned relative to the substrate between depositions.

An integrated layer can be obtained through a variety of means. For example, in batch systems where the dielectric material is plasma polymerized, the feed gas can be switched from the dielectric material feed to the polymeric surface treatment feed. Alternatively, when the dielectric material is sputtered, integration can be accomplished by changing sputter targets. In batch systems where a deposition method other than plasma-based deposition is used to deposit the dielectric material, plasma polymerization or sputtering can commence in the same vacuum chamber before the dielectric layer deposition has been completed, thus integrating the two layers. In a reel-to-reel system, the layers can be integrated, for example, by passing a web from a zone for deposition of the dielectric (by, for example, plasma polymerization, sputtering, e-beam, or like) to a zone down the web for deposition of the polymeric surface treatment by plasma-based deposition. Optionally, in a reel-to-reel system, the two zones of deposition may overlap so that the dielectric material and the polymeric surface treatment layers are firmly interlocked.

After the polymeric layer has been deposited using a plasma-based deposition technique, residual free radicals in the polymeric layer can optionally be quenched to further improve the layer's properties. This quenching treatment can be accomplished, for example, using the application of heat, electromagnetic radiation, or any other treatment that provides a species to further react with the polymeric layer such as a hydrogen plasma, or another method that provides atomic hydrogen to react with the plasma polymerized layer, or a combination thereof.

The patterning of the thin film electrodes, gate dielectric, and the semiconductor layer can be accomplished by known methods such as shadow masking, additive photolithography, subtractive photolithography, printing, microcontact printing, and pattern coating (preferably, by shadow masking).

Optional patterning of the polymeric layer can also be accomplished using shadow masking. Patterning of the polymeric layer can be desirable, for example, when the OTFTs of the invention are part of an integrated circuit and unpatterned or continuous polymeric layer would provide resistance between transistors.

Shadow masks enable deposition of a desired material and, simultaneously, formation of the material in a desired preselected pattern. Accordingly, there is no need for a separate patterning step preceding or following deposition.

Preferably, the OTFT layers or features are deposited through the pattern of a shadow mask formed from a polymer material such as, for example, polyimide or polyester. Polymer shadow masks typically have a thickness of between about 5 micrometers and about 50 micrometers. The use of polymeric materials for shadow masks can provide advantages over other materials, including ease of fabrication of the shadow mask, reduced cost of the shadow mask, and other advantages. However, non-polymeric materials such as, for example, silicon, metals, or crystalline materials can be used. Polymer shadow masks are flexible and are generally less prone to damage due to the accidental formation of creases or permanent bends, though. In addition, polymer shadow masks are less damaging to existing deposited layers. Furthermore, some polymer masks can be cleaned with acids.

Two or more OTFT layers or features can be deposited through one or more shadow masks, or each of the OTFT layers or features can be deposited through a single shadow mask. The arrangement and shape of deposition apertures are subject to wide variation depending upon the OTFT and circuit layout envisioned by the user. One or more deposition apertures can be formed to have widths less than approximately 1000 micrometers (preferably, less than approximately 50 micrometers; more preferably, less than approximately 20 micrometers; even more preferably, less than approximately 10 micrometers; most preferably, less than approximately 5 micrometers). By forming deposition apertures to have widths in these ranges, the sizes of the OTFT or circuit elements may be reduced. Moreover, a distance (gap) between two deposition apertures can be less than approximately 1000 micrometers (preferably, less than approximately 50 micrometers; more preferably, less than approximately 20 micrometers; most preferably, less than approximately 10 micrometers) to reduce the size of various TFT or circuit elements. When making, using, reusing, or repositioning the shadow masks, the distances between features, such as the distance between apertures or the distance between sub-patterns can be reproducible to within approximately 1.0 percent (preferably, approximately 0.5 percent, more preferably, approximately 0.1 percent).

Laser ablation techniques can be used to define the pattern of deposition apertures in polymer shadow masks. Accordingly, formation of a shadow mask from a polymeric film can allow the use of fabrication processes that can be less expensive, less complicated, and/or more precise than those generally required for other aperture masks such as, for example, silicon masks or metallic masks. Moreover, because laser ablation techniques can be used to create a pattern, the width of the pattern can be made much larger than conventional patterns. For example, laser ablation techniques can facilitate the creation of a pattern such that the width of the pattern is greater than approximately one centimeter, greater than approximately 25 centimeters, greater than approximately 100 centimeters, or even greater than approximately 500 centimeters. These large masks, which can be the width of a web, and very long (for example, the length of a roll), can then be used in a deposition process to create OTFT or circuit elements that are distributed over a large surface area and separated by large distances.

Alternatively, if a shadow mask is formed from a silicon wafer, the pattern of apertures can be created using reactive ion etching or laser ablation. Metal masks can be made by a variety of techniques including, for example, conventional machining, micromachining, diamond machining, plasma or reactive ion etching, and electric discharge machining (EDM) or spark-erosion machining.

Each of the OTFT layers or features can also be deposited through one or more separate aperture masks of a mask set. A mask set includes a number of aperture masks for use in a deposition process. Mask sets can include any number of shadow masks, for example, depending upon the OTFT or circuit element to be created in the deposition process. The masks form a "set" in that each mask can correspond to a particular layer or set of OTFT or circuit elements within a TFT or integrated circuit. Each shadow mask can be formed with a pattern of deposition apertures that defines at least a part of a layer of an OTFT or circuit.

A deposition station can be used for performing a vapor deposition or plasma-based deposition process in which material is vaporized and deposited on a substrate through a shadow mask. The deposition station is typically a vacuum chamber.

For vapor deposition, a shadow mask is placed in proximity to a substrate, and then the material to be deposited is vaporized by a deposition unit. The deposition unit can include a boat of material that is heated to vaporize the material. The vaporized material deposits on the substrate through the aperture(s) of a shadow mask to define at least a portion of an OTFT or circuit layer on the substrate. Upon deposition, the material forms the pattern defined by the shadow mask.

For plasma-based deposition, a similar process can be used. After a shadow mask is placed in proximity to a substrate, the material to be deposited is vaporized by exposure to vacuum, optionally with heating. A carrier gas can be used to transport the deposition material from its reservoir to the vacuum chamber by bubbling the gas through the liquid deposition material (that is, liquid monomer). By external application of DC or RF energy through electrodes in the chamber, the resulting plasma polymer deposits on the substrate though the aperture(s) of a shadow mask.

When each layer of an OTFT is vapor deposited or deposited by plasma-based techniques in a vacuum chamber, the OTFT can be fabricated in its entirety without breaking vacuum.

Shadow mask patterns can also be formed in one or more elongated webs of flexible film. Materials can be sequentially deposited through shadow mask patterns formed in the webs to define layers or elements of an OTFT or circuit. A deposition substrate can also be formed from an elongated web, and the deposition substrate web can be fed through a series of deposition stations. Each deposition station can have its own elongated web formed with aperture mask patterns.

In-line shadow mask deposition techniques can be carried out, for example, by moving a web of polymeric film formed with aperture mask patterns past a deposition substrate. In-line shadow mask deposition techniques can also be carried out using a deposition substrate that comprises a web. That is, both the shadow mask and the deposition substrate can comprise webs. The webs can be made, for example, from polymeric material.

Further details regarding shadow masking techniques can be found in U.S. patent application Ser. Nos. 03/0151118 (Baude et al.), 03/0152691 (Baude et al.), and 03/0150384 (Baude et al.), which are herein incorporated by reference.

Integrated Circuits

A plurality of TFTs can be interconnected to form an integrated circuit (IC). Integrated circuits include but are not limited to, for example, ring oscillators, radio-frequency identification (RFID) circuitry, logic elements, amplifiers, and clocks. Therefore, OTFTs made according to the method of present invention can be interconnected to other TFTs by means known in the art to form ICs. OTFTs of the invention can also be used in various organic electronic articles such as, for example, RFID tags, backplanes for displays (for use in, for example, personal computers, cell phones, or handheld devices), smart cards, memory devices, and the like.

EXAMPLES

Objects and advantages of this invention are further illustrated by the following examples, but the particular materials and amounts thereof recited in these examples, as well as other conditions and details, should not be construed to unduly limit this invention.

Test Methods

A. Film Thickness

Single wavelength ellipsometry was employed to obtain estimates of polymeric layer thickness. Substrate values of Psi and Delta ($\psi_s$ and $\Delta_s$) were obtained from the cleaned substrates (described below) at an angle of incidence of 70° and a wavelength of 632.8 nm using a Gaertner Dual Mode Automatic Ellipsometer, model L116A (Gaertner Co., Skokie, Ill.). The polymeric layer was applied to the substrates, and values were measured ($\psi_f$ and $\Delta_f$).

Ellipsometry modeling software, WVASE32 (from J. A. Woollam, Inc., Lincoln, Nebr.) was used to construct optical models appropriate to the specific polymer and substrate investigated. Material optical constants included with the program were used unless specified otherwise.

For thermal oxide on silicon substrates, the optical model consisted of 1000 Å of $SiO_2$ on 50 Å of an intermix layer (a Bruggeman effective medium approximation consisting of 50% $SiO_2$ and 50% Si) on top of a silicon substrate. The floating variables in the fit were the $SiO_2$ thickness, the intermix layer thickness and the intermix layer $SiO_2$ percentage (where the Si percentage is adjusted to make up the balance of the interlayer composition). Typical fit values were 950-990 Å $SiO_2$, 40-60 Å intermix consisting of 20-60% $SiO_2$.

For alumina layers on silicon substrates, the optical model was 1500 Å of $Al_2O_3$ on Si. The floating variables in the fit were the thickness in Angstroms (d) and refractive index (n) of the $Al_2O_3$. Seed values of d=1500 and n=1.6 were used. Typical final fit values were between 1400 Å and 1700 Å with n between 1.56 and 1.60.

Once the substrate parameters were determined by modeling $\psi_s$ and $\Delta_s$, they were fixed and a polymer layer was added to the optical model, between the air and dielectric layers. This layer had a variable thickness, but its refractive index was fixed at 1.588. The polymeric layer thickness was then varied to achieve the best fit to $\psi_f$ and $\Delta_f$. Each thickness reported in Table 1 (below) is the average of four measurements on each sample.

B. Water Contact Angle (WCA)

Static, advancing, and receding water contact angles were measured with a video contact angle apparatus (Model VCA-2500XE, from AST Products, Billerica, Mass.). Values reported are averages of measurements on both sides of at least three drops on each tested surface. Estimated uncertainties in these measurements were +/−1 degree in static and advancing measurements and +/−2 degrees in receding measurements. Surface characterization data are summarized in Table 1 (below).

C. Thin Film Transistor Performance

Transistor performance was tested at room temperature in air using techniques known in the art, for example as shown in S. M. Sze, *Physics of Semiconductor Devices*, page 442, John Wiley & Sons, New York (1981), which is herein incorporated by reference. A Semiconductor Parameter Analyzer (model 4145A from Hewlett-Packard, Palo Alto, Calif.) was used to obtain the results below.

For p-type semiconductors, the square root of the drain current ($I_d$) was plotted as a function of gate-source bias ($V_g$), from +10V to −40V for a constant source-drain bias ($V_d$) of −40V. The saturation field effect mobility was calculated from the straight line portion of the curve using the specific capacitance of the gate dielectric, the channel width and the channel length. The x-axis extrapolation of this straight-line fit was taken as the threshold voltage ($V_t$). In addition, plotting $I_d$ as a function of $V_g$ yielded a curve where a straight line fit was drawn along a portion of the curve containing $V_t$. The inverse of the slope of this line was the subthreshold slope (S). The on-off ratio was taken as the difference between the minimum and maximum drain current ($I_d$) values of the $I_d$-$V_g$ curve.

Device Preparation and Testing

Substrates

Single crystal <100> orientation heavily-doped silicon wafers were obtained from Silicon Valley Microelectronics (San Jose, Calif.). A 1500 Å layer of alumina (Wafer A), or a 1000 Å layer of high temperature thermal silicon oxide (Wafer B) was deposited on each wafer front via chemical vapor deposition methods. A 5000 Å layer of aluminum metal was vapor deposited onto the backside of each wafer. In this demonstration, the doped wafer capped with aluminum served as the gate electrode and the aluminum oxide, or silicon oxide, functioned as the gate dielectric when organic thin film transistors were prepared.

Wafer Preparation and Polymeric Layer

Wafer substrates were washed sequentially in heptane, acetone, and 2-propanol, then dried in a stream of nitrogen gas. They were then further cleaned by a 10 minute exposure in a UV/ozone chamber. The samples were placed on the powered electrode of a plasma polymerization chamber, where the chamber walls constituted the opposing grounded electrode. The chamber was pumped by a roots blower (Model 1200, BOC Edwards, Wilminton, Mass.) backed by a dry mechanical pump (Model iQDP80, BOC Edwards, Wilmington, Mass.) down to a base pressure of 0.010 torr. Alpha-methylstyrene (Aldrich Chemical) was admitted to the chamber through a stainless steel bubbler heated to 55° C. Argon flowing at a rate of 100 sccm was used as the carrier gas for introducing the alpha-methylstyrene to the plasma polymerization chamber. The plasma was driven by a radio-frequency (rf) power supply (Model RF30H, Advanced Energy, Fort Collins, Co.) operating at 13.56 Mhz. The plasma was run in a pulsed mode at a given power (see examples below), using a 10% "ON" to 90% "OFF" duty cycle while maintaining a pulsing frequency of 10 Hz. After a specified time had elapsed to allow enough film thickness to build up, the plasma deposition was stopped, the chamber was vented to the atmosphere, and the samples were removed. Ellipsometric film thickness and water contact angles were measured using the procedures outlined above. Results appear in the tables below.

Semiconductor

Pentacene (available from Aldrich Chemical) was purified in a 3-zone furnace (Thermolyne 79500 tube furnace, from Barnstead Thermolyne, Dubuque, Iowa) at reduced pressure under a constant flow of hydrogen (2%) in nitrogen gas.

The purified pentacene was deposited by sublimation under vacuum (approximately $10^{-6}$ Torr (or $1.33\times10^{-4}$ Pa)) onto the polymeric layer at a rate of 0.5 Å per second to reach a thickness of 300 Å as measured by a quartz crystal microbalance.

Final Steps for Device Preparation and Testing

Gold source and drain electrodes were shadow masked onto the p-type semiconductor layer. The device dimensions were 40 μm to 120 μm channel length×1000 μm channel width.

Multiple OTFTs were prepared and a representative sample of at least three pentacene OTFTs was tested for each of at least two pentacene deposition runs. Averaged results appear below in Table 2.

Example 1

The power for the pulsed plasma polymerization was set to 300 W. Wafer A was used. (alumina/Si)

Example 2

The power for the pulsed plasma polymerization was set to 300 W. Wafer B was used. (thermal $SiO_2$/Si)

Example 3

The power for the pulsed plasma polymerization was set to 900 W. Wafer A was used. (alumina/Si)

Example 4

The power for the pulsed plasma polymerization was set to 900 W. Wafer B was used. (thermal $SiO_2$/Si)

Comparative Example A

Wafer A was used as received.

Comparative Example B

Wafer B was used as received.

TABLE 1

| Example | Power | Substrate Type | Thickness | Water Contact Angle adv/stat/rec |
|---|---|---|---|---|
| 1 | 300 W | $Al_2O_3$/Si | 117 Å | 78/68/37 |
| 2 | 300 W | $SiO_2$/Si | 139 Å | 79/68/38 |
| 3 | 900 W | $Al_2O_3$/Si | 18 Å | 83/67/37 |
| 4 | 900 W | $SiO_2$/Si | 26 Å | 80/68/36 |

TABLE 2

| Example | Vt | Mobility ($cm^2/V \cdot s$) | Subthreshold Slope | On/off Ratio |
|---|---|---|---|---|
| 1 | −12.15 | 0.75 | 1.10 | 6.11E+5 |
| 2 | −9.31 | 0.40 | 3.29 | 5.39E+5 |
| 3 | −10.93 | 0.74 | 1.00 | 1.4E+6 |
| 4 | −6.66 | 0.39 | 1.31 | 4.54E+5 |
| Comparative A | −6.89 | 0.80 | 0.96 | 1.29E+6 |
| Comparative B | −9.02 | 0.45 | 2.19 | 4.21E+5 |

Differentiation from Spin-coated Poly(alpha-methylstyrene)

A silicon wafer was cleaned using the procedures outlined above. It was then spin coated with a 1.5% by weight solution of poly(alpha-methylstyrene) (Aldrich Chemical) in toluene. The wafer was then baked in air at 100° C. for 10 minutes. Its thickness was measured by ellipsometry to be 494 Å. It was rinsed for 20 seconds in a stream of toluene, and blown dry. It was again examined by ellipsometry, and the thickness of the remaining film was found to be 4 Å. This yields a loss of polymer due to rinsing of >99%.

A small sample of wafer from Example 1 was remeasured by ellipsometry and found to have a plasma polymerized alpha-methylstyrene layer thickness of 117 Å. It was rinsed in toluene for 20 seconds and blown dry. It was again examined by ellipsometry and found to have a plasma polymerized alpha-methylstyrene layer thickness of 108 Å. This yields a loss of polymer due to rinsing of 8%.

A small sample of wafer from Example 2 was remeasured by ellipsometry and found to have a plasma polymerized alpha-methylstyrene layer thickness of 138 Å. It was rinsed in toluene for 20 seconds and blown dry. It was again examined by ellipsometry and found to have a plasma polymerized alpha-methylstyrene layer thickness of 120 Å. This yields a loss of polymer due to rinsing of 13%.

Patterned Layers of Plasma Polymerized Alpha-methylstyrene

Figure 2:
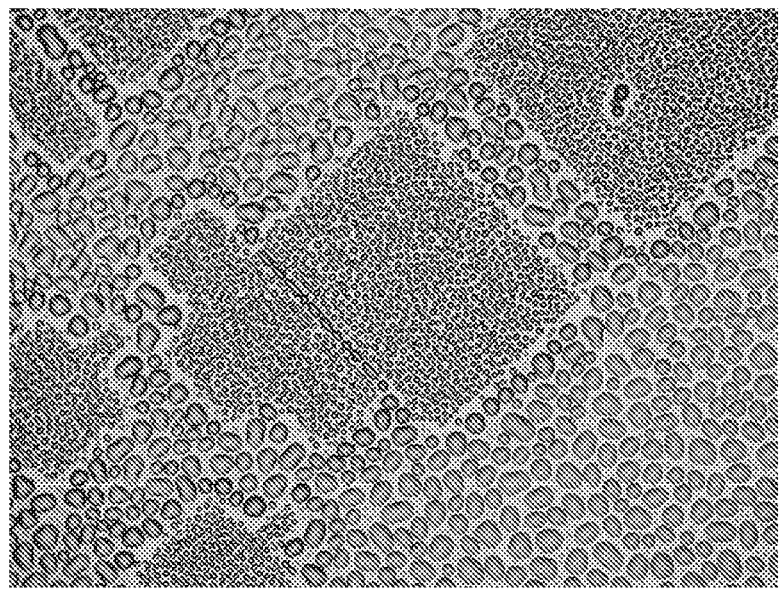
FIG. 2 is a photograph of a patterned polymeric layer deposited on a silicon wafer by plasma polymerization at 900 W.

Two shadow masks were created by laser ablation of a pattern of holes into a polyimide film. Two silicon wavers were cleaned via the above-mentioned solvent washing and UV-ozone exposure. One shadow mask was taped to each wafer. One such masked wafer was included in the 300 W plasma polymerization (Example 1) and another in the 900 W plasma polymerization (Example 3). After the plasma polymerized layer had been deposited and the sample removed from the deposition chamber, condensation images were taken by cooling the silicon wafer to the point were water vapor began to condense as water droplets on the sample, revealing the patterned layers. The samples were then examined using optical microscopy. FIG. 1 shows the 300 W sample, and FIG. 2 shows the 900 W sample.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A method of making an organic electronic device comprising:
    (a) depositing a substantially nonfluorinated polymeric layer onto a dielectric layer using a plasma-based deposition technique selected from the group consisting of (i) plasma polymerizing a precursor comprising monomers, wherein plasma polymerization is performed using pulsed-plasma excitation, and (ii) sputtering from a target comprising one or more polymers of interpolymerized units of monomers, said monomers being selected from the group consisting of aromatic monomers, substantially hydrocarbon monomers, andcombinations thereof; and
    (b) depositing an organic semiconductor layer adjacent to said polymeric layer.

2. The method of claim 1 wherein said monomers are aromatic monomers.

3. The method of claim 2 wherein said aromatic monomers comprise only hydrocarbon substituents.

4. The method of claim 1 wherein said polymeric layer comprises interpolymerized units of monomers selected from the group consisting of naphthalene, benzene, ethyl benzene, toluene, xylene, mesitylene, styrenes, phenylacetylene, and combinations thereof.

5. The method of claim 4 wherein said polymeric layer comprises styrenic interpolymerized units.

6. The method of claim 5 wherein said styrenic interpolymerized units are derived from monomers selected from the group consisting of α-methylstyrene, 4-tert-butylstyrene, 2-methylstyrene 3-methylstyrene, 4-methylstyrene, and combinations thereof.

7. The method of claim 6 wherein said styrenic interpolymerized units are derived from α-methylstyrene.

8. The method of claim 1 wherein said dielectric layer is deposited using a plasma-based deposition technique, and said dielectric layer and said polymeric layer are an integrated layer.

9. The method of claim 1 wherein said polymeric layer is deposited onto said dielectric layer through an aperture in a shadow mask.

10. The method of claim 9 wherein said polymeric layer forms a preselected pattern.

11. The method of claim 9 wherein said dielectric layer is deposited through an aperture in said shadow mask or an aperture in a second shadow mask using a plasma-based deposition technique, and said dielectric layer and said polymeric layer are an integrated layer.

12. The method of claim 1 wherein said polymeric, layer is deposited by plasma polymerizing a precursor comprising monomers.

13. The method of claim 1 further comprising quenching residual free radicals in said polymeric layer.

14. The method of claim 1 wherein said organic electronic device is an organic thin film transistor and said dielectric layer is a gate dielectric.

15. The method of claim 14 further comprising the step of interconnecting said organic thin film transistor to at least one other thin film transistor to form an integrated circuit.

16. A method of making an organic thin film transistor comprising:
   (a) providing a substrate,
   (b) vapor depositing a gate electrode material on said substrate,
   (c) vapor depositing a gate dielectric on said gate electrode material,
   (d) plasma polymerizing a precursor comprising monomers selected from the group consisting of aromatic monomers, substantially hydrocarbon monomers, and combinations thereof onto said gate dielectric to form a substantially nonfluorinated polymeric layer thereon, wherein plasma polymerization is nerformed using pulsed-plasma excitation,
   (e) vapor depositing an organic semiconductor layer adjacent to-said polymeric layer, and
   (f) vapor depositing a source electrode and a drain electrode contiguous to said organic semiconductor layer.

17. The method of claim 16 wherein one or more of said gate electrode material, said gate dielectric, said polymeric layer, said organic semiconductor layer, and said source electrode and drain electrode is deposited. through an aperture in a shadow mask.

18. The method of claim 17 wherein each of said gate electrode material, said gate dielectric, said polymeric layer, said organic semiconductor layer, and said source electrode and drain electrode is deposited through one or more apertures in one or more shadow masks.

* * * * *

UNITED STATES PATENT AND TRADEMARK OFFICE
CERTIFICATE OF CORRECTION

PATENT NO. : 7,399,668 B2
APPLICATION NO. : 10/954413
DATED : July 15, 2008
INVENTOR(S) : Timothy D. Dunbar Page 1 of 1

It is certified that error appears in the above-identified patent and that said Letters Patent is hereby corrected as shown below:

Page 2, Column 2 (Other Publications)
Line 18, delete "$H^2$" and insert in place thereof -- $H_2$ --.

Column 8
Line 37, delete "film 2" and insert in place thereof -- film (film 2) --.

Column 15 (Table 2)
Line 22, delete "Vt" and insert in place thereof -- $V_t$ --.

Column 16
Line 26-27 (approx.), in Claim 1, delete "andcombinations" and insert in place thereof -- and combinations --.

Line 44 (approx.), in Claim 6, after "methylstyrene" insert -- , --.

Line 63, in Claim 12, delete "polymeric," and insert in place thereof -- polymeric --.

Column 18
Line 2, in Claim 16, delete "nerformed" and insert in place thereof -- performed --.

Line 5, in Claim 16, delete "to-said" and insert in place thereof -- to said --.

Line 11, in Claim 17, delete "deposited." and insert in place thereof -- deposited --.

Signed and Sealed this

Fourth Day of November, 2008

JON W. DUDAS
*Director of the United States Patent and Trademark Office*